United States Patent
Oh et al.

(10) Patent No.: US 8,680,500 B2
(45) Date of Patent: Mar. 25, 2014

(54) PHASE CHANGE MEMORY DEVICES HAVING BURIED METAL SILICIDE PATTERNS

(75) Inventors: Gyu-Hwan Oh, Hwaseong-si (KR); Byoung-Jae Bae, Hwaseong-si (KR); Dong-Hyun Im, Hwaseong-si (KR); Doo-Hwan Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/495,178

(22) Filed: Jun. 13, 2012

(65) Prior Publication Data
US 2012/0326110 A1 Dec. 27, 2012

(30) Foreign Application Priority Data
Jun. 27, 2011 (KR) ........................ 10-2011-0062031

(51) Int. Cl.
*H01L 29/02* (2006.01)
*H01L 47/00* (2006.01)
*H01L 27/148* (2006.01)
*H01L 29/768* (2006.01)

(52) U.S. Cl.
USPC .................. 257/2; 257/4; 257/246; 257/248; 257/E27.002

(58) Field of Classification Search
USPC ........................ 257/2, 4, 246, 248, E27.002
See application file for complete search history.

(56) References Cited

U.S. PATENT DOCUMENTS

| | | | | |
|---|---|---|---|---|
| 6,245,603 B1 * | 6/2001 | Shinohara | ...................... | 438/197 |
| 7,612,360 B2 * | 11/2009 | Lee et al. | ........................ | 257/3 |
| 7,671,395 B2 * | 3/2010 | Park et al. | ..................... | 257/303 |
| 7,714,394 B2 * | 5/2010 | Shin et al. | ..................... | 257/375 |
| 7,737,512 B2 * | 6/2010 | Jang et al. | ..................... | 257/413 |
| 7,759,667 B2 * | 7/2010 | Park et al. | ........................ | 257/3 |
| 7,803,679 B2 | 9/2010 | Park et al. | | |
| 7,804,703 B2 * | 9/2010 | Ha et al. | ........................ | 365/148 |
| 7,906,773 B2 * | 3/2011 | Ko et al. | ........................ | 257/2 |
| 7,994,493 B2 * | 8/2011 | Cho et al. | ........................ | 257/5 |
| 8,008,167 B2 * | 8/2011 | Park | ............................ | 438/478 |
| 8,120,005 B2 * | 2/2012 | Park et al. | ........................ | 257/4 |
| 8,361,852 B2 * | 1/2013 | Jeong | ........................... | 438/197 |
| 8,384,062 B2 * | 2/2013 | Happ et al. | ........................ | 257/5 |
| 8,416,616 B2 * | 4/2013 | Chang et al. | ................. | 365/163 |
| 8,461,566 B2 * | 6/2013 | Tang et al. | ........................ | 257/5 |
| 8,466,505 B2 * | 6/2013 | Lai et al. | ..................... | 257/315 |
| 2008/0191188 A1 * | 8/2008 | Jeong | ........................... | 257/4 |
| 2010/0061140 A1 | 3/2010 | Klostermann et al. | | |
| 2010/0144090 A1 * | 6/2010 | Song et al. | ..................... | 438/104 |
| 2010/0181549 A1 * | 7/2010 | Kim et al. | ........................ | 257/3 |
| 2011/0092041 A1 * | 4/2011 | Lai et al. | ..................... | 438/381 |
| 2012/0267595 A1 * | 10/2012 | Fang et al. | ........................ | 257/2 |

FOREIGN PATENT DOCUMENTS

KR 10-0852233 B1 8/2008
KR 10-2010-0052306 A 5/2010

* cited by examiner

*Primary Examiner* — Ida M Soward
(74) *Attorney, Agent, or Firm* — Lee & Morse, P.C.

(57) ABSTRACT

A phase change memory device includes an impurity region on a substrate, the impurity region being in an active region, a metal silicide pattern at least partially buried in the impurity region, a diode on the impurity region, a lower electrode on the diode, a phase change layer pattern on the lower electrode, and an upper electrode on the phase change layer pattern.

13 Claims, 15 Drawing Sheets

2ND DIRECTION
⊗ ← 1ST DIRECTION

2ND DIRECTION
⊗ ← 1ST DIRECTION

2ND DIRECTION
 ← 1ST DIRECTION

PHASE CHANGE MEMORY DEVICES HAVING BURIED METAL SILICIDE PATTERNS

CROSS-REFERENCE TO RELATED APPLICATION

This application claims priority under 35 USC §119 to Korean Patent Application No. 10-2011-0062031 filed on Jun. 27, 2011, in the Korean Intellectual Property Office (KIPO), the entire disclosure of which is incorporated herein by reference.

BACKGROUND

1. Field

Example embodiments relate to phase change memory devices and methods of manufacturing the same.

2. Description of the Related Art

In a phase change memory device, data may be stored using a resistance difference generated when a phase change material pattern undergoes a phase transition between an amorphous state and a crystalline state. The phase change memory device may include a switching device, e.g., a P-N diode or a transistor. A cell of the phase change memory device may be downsized when a P-N diode is employed as the switching device instead of a transistor.

SUMMARY

Example embodiments may provide phase change memory devices having improved operational characteristics.

Example embodiments may provide methods of manufacturing phase change memory devices having improved operational characteristics.

Example embodiments may provide a phase change memory device, including an impurity region on a substrate, the impurity region being in an active region, a metal silicide pattern at least partially buried in the impurity region, a diode on the impurity region, a lower electrode on the diode, a phase change layer pattern on the lower electrode, and an upper electrode on the phase change layer pattern.

The substrate may be divided into the active region and an isolation region by an isolation layer pattern, the metal silicide pattern contacting a sidewall of the isolation layer pattern.

Bottom surfaces of the metal silicide pattern and the impurity region may be coplanar with each other.

A bottom surface of the impurity region may be lower than that of the metal silicide pattern.

The metal silicide pattern may include two metal silicide patterns at opposite lateral portions of the impurity region, the two metal silicide patterns being spaced apart from each other.

The metal silicide pattern may include cobalt silicide or nickel silicide.

The impurity region may be a word line extending in a second direction.

The metal silicide pattern may extend in the second direction.

The device may further include a bit line electrically connected to the upper electrode, the bit line extending in a first direction perpendicular to the second direction.

An upper surface of the metal silicide pattern may be between upper and bottom surfaces of the impurity region, the upper surface of the metal silicide pattern facing away from the substrate.

Example embodiments may also provide a phase change memory device, including an impurity region in an upper portion of a substrate, the impurity region being a word line, a metal silicide pattern inside the impurity region, an upper surface of the metal silicide pattern being spaced a predetermined distance from an upper surface of the impurity region, a diode on the upper surface of the impurity region, the upper surfaces of the metal silicide pattern and the impurity region facing the diode, a lower electrode on the diode, a phase change layer pattern on the lower electrode, and an upper electrode on the phase change layer pattern.

The device may further include an isolation layer pattern through the impurity region, the metal silicide pattern contacting the isolation layer pattern.

The device may further include an isolation layer pattern defining the active region, the impurity region extending in the entire active region, and the metal silicide pattern contacting the isolation layer pattern.

Example embodiments may also provide a method of manufacturing a phase change memory device, the method including forming an impurity region on a substrate, the impurity region being in an active region, forming a metal silicide pattern at least partially buried in the impurity region, forming a diode on the impurity region, forming a lower electrode on the diode, forming a phase change layer pattern on the lower electrode, and forming an upper electrode on the phase change layer pattern.

The method may further include forming a plurality of trenches by partially etching the substrate, forming a first isolation layer pattern partially filling the trenches, forming a spacer on sidewalls of the trenches, removing an upper portion of the first isolation layer pattern to expose a portion of the substrate between the spacer and the first isolation layer pattern, transforming the exposed portion of the substrate into the metal silicide pattern, and implanting impurities into an upper portion of the substrate to form the impurity region.

Transforming the exposed portion of the substrate into the metal silicide pattern may include forming a metal layer on the spacer, the exposed portion of the substrate, and the first isolation layer pattern, and reacting the metal layer with the exposed portion of the substrate.

After reacting the metal layer with the exposed portion of the substrate, the method may further include removing an unreacted portion of the metal layer, removing the spacer, and forming a second isolation layer pattern filling a remaining portion of the trench.

The metal layer may be formed using cobalt and/or nickel.

Bottom surfaces of the metal silicide pattern and the impurity region may be formed to be coplanar with each other.

The method may further include forming an upper electrode on the phase change layer pattern, and forming a bit line electrically connected to the upper electrode, the bit line extending in a first direction, and the impurity region and the metal silicide pattern extending in a second direction perpendicular to the first direction.

BRIEF DESCRIPTION OF THE DRAWINGS

Features will become apparent to those of ordinary skill in the art by describing in detail exemplary embodiments with reference to the attached drawings, in which.

Figure 1A:
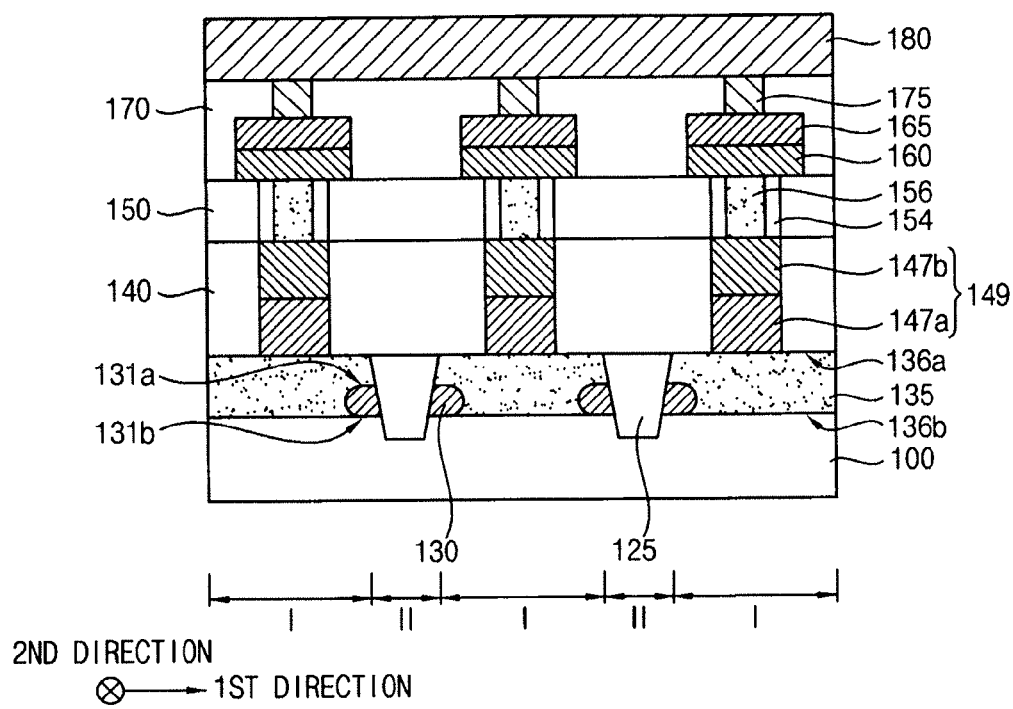
FIGS. 1A and 1B illustrate cross-sectional views of phase change memory devices in accordance with example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will be understood that when an element or layer is referred to as being "connected to" or "coupled to" another element or layer, it can be directly connected or coupled to the other element or layer or intervening elements or layers may also be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "adjacent" versus "directly adjacent", etc.). Like numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
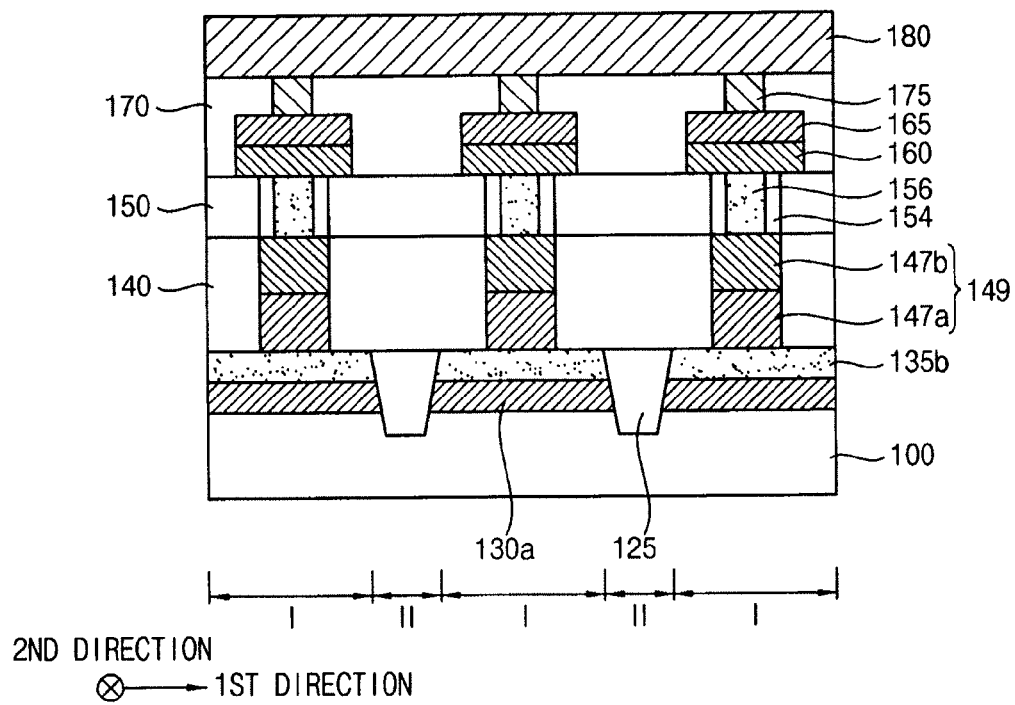

FIGS. 1A and 1B are cross-sectional views of phase change memory devices in accordance with example embodiments.

Referring to FIG. 1A, a phase change memory device may include a substrate 100, an impurity region 135, a metal silicide pattern 130, a P-N diode 149, a lower electrode 156, a phase change layer pattern 160, and an upper electrode 165. The phase change memory device may further include a bit line 180 electrically connected to the upper electrode 165.

The substrate 100 may include, e.g., a silicon substrate, a germanium substrate, a silicon-germanium substrate, a silicon-on-insulator (SOI) substrate, a germanium-on-insulator (GOI) substrate, etc. The substrate 100 may be divided into an active region I and an isolation region II by an isolation layer pattern 125. A portion of the substrate 100 on which the isolation layer pattern 125 is formed may be defined as the isolation region II, and a portion of the substrate 100 not including the isolation layer pattern 125 may be defined as the active region I.

The impurity region 135 may be formed at an upper portion of the substrate 100 in the active region I. In example embodiments, the impurity region 135 may be formed between adjacent isolation layer patterns 125, and may extend in a second direction. A plurality of the impurity regions 135 may be formed regularly along a first direction substantially perpendicular to the second direction, e.g., the impurity regions 135 may be spaced apart from each other along the first direction. In example embodiments, the impurity region 135 in the active region I may serve as a word line.

The metal silicide pattern 130 may be formed at a lateral portion of the impurity region 135 to make contact with a sidewall of the isolation layer pattern 125. In example embodiments, a pair of the metal silicide patterns 130 may be formed individually at both lateral portions, e.g., at opposing ends, of the impurity region 135 to contact different isolation layer patterns 125. For example, a metal silicide pattern 130 between a first isolation layer pattern 125 and a second isolation layer pattern 125 may include first and second metal silicide patterns 130 at the opposing ends to contact the first and second isolation layer patterns 125, respectively. The metal silicide pattern 130 may not contact a top surface, i.e., a surface facing away from the substrate 100, of the impurity region 135, e.g., a portion of the impurity region 135 may separate the metal silicide pattern 130 from an overlying layer, e.g., from a first interlayer insulating layer 140 on the impurity region 140. For example, bottom surfaces 131b of the metal silicide pattern 130 and bottom surfaces 136b of the impurity region 135 may be coplanar with each other. As illustrated in FIG. 1A, the bottom surfaces 131b and 136b are surfaces facing the substrate 100. For example, at least a portion of the metal silicide pattern 130 may be buried or embedded inside the impurity region 135. Thus, the word line, i.e., the impurity region 135, of the phase change memory device may have reduced electrical resistance.

In one example embodiment, the bottom surface 131b of the metal silicide pattern 130 may be higher than that of the impurity region 135. That is, the metal silicide pattern 130 may be completely embedded within the impurity region 135, so each of an upper surface 131a and the bottom surface 131b of the metal silicide pattern 130 is spaced apart from respective upper and bottom surfaces 136a,136b of the impurity region 135.

According to example embodiments illustrated in FIG. 1A, the two metal silicide patterns 130 spaced apart from each other along the first direction may be formed individually at both lateral portions of the impurity region 135. However, in other example embodiments, the two metal silicide patterns may be connected to each other. For example, as illustrated in FIG. 1B, a single metal silicide pattern 130a may extend between two adjacent isolation layer patterns 125 to contact each of the isolation layer patterns 125. For example, the metal silicide pattern 130a may be disposed under an impurity region 135b in the active region I, e.g., the metal silicide pattern 130a may be between the impurity region 135b and the substrate 100, as illustrated in FIG. 1B. In another example, the metal silicide pattern 130a may be disposed between two impurity regions in an upper portion of the active region I.

The P-N diode 149 may be disposed on the impurity region 135 through the first insulating interlayer 140. The first insulating interlayer 140 may be formed on the substrate 100 and the isolation layer pattern 125.

The P-N diode 149 may include a first conductive pattern 147a and a second conductive pattern 147b sequentially stacked on the impurity region 135. For example, the first conductive pattern 147a may include N-type impurities and the second conductive pattern 147b may include P-type impurities. In one example embodiment, an ohmic pattern (not illustrated) including, e.g., a metal silicide, may be further disposed on the second conductive pattern 147b.

The lower electrode 156 may be disposed on the second conductive pattern 147b through a second insulating interlayer 150 formed on the first insulating interlayer 140. A spacer 154 enclosing a sidewall of the lower electrode 156 may be further formed. The lower electrode 156 may function as a heater converting a current to a Joule-heat. A contact area between the lower electrode 156 and the second conductive pattern 147b may be decreased by the spacer 154 so that a heating efficiency may be increased. In example embodiments, the spacer 154 may include silicon nitride. The lower electrode 156 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

The phase change layer pattern 160 may be disposed on the lower electrode 156 and the spacer 154, and the upper electrode 165 may be disposed on the phase change layer pattern 160. The phase change layer pattern 160 may include a phase change material that may undergo a phase-transition by the Joule-heat from the lower electrode 156. The phase change material may include a chalcogen compound or a chalcogen compound doped with carbon, nitrogen and/or a metal. The chalcogen compound may include, e.g., at least one of GeSbSe, SbSe, GeSbTe, SbTe, GeSb, AsSbTe, SnSbTe, SnInSbTe, etc. These may be used alone or in a mixture thereof. The upper electrode 165 may include doped polysilicon, a metal, a metal nitride, and/or a metal silicide, etc.

A third insulating interlayer 170 covering the upper electrode 165 and the phase change layer pattern 160 may be formed on the second insulating interlayer 150. An upper electrode contact 175 may make contact with the upper electrode 165 through the third insulating interlayer 170. The bit line 180 may be disposed on the third insulating interlayer 170 to be electrically connected to the upper electrode 165 via the upper electrode contact 175. In example embodiments, the bit line 180 may extend in the first direction.

Figure 2:
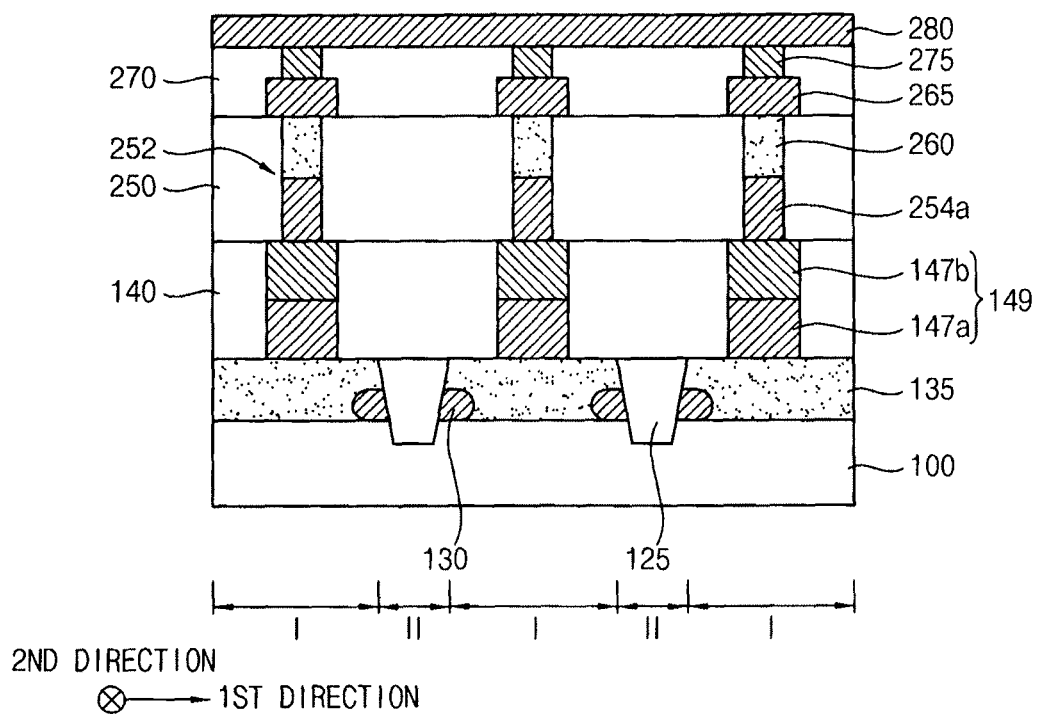
FIG. 2 illustrates a cross-sectional view of a phase change memory device in accordance with some example embodiments.

FIG. 2 is a cross-sectional view of a phase change memory device in accordance with some example embodiments. The phase change memory device of FIG. 2 may have a construction substantially the same as or similar to that of the phase change memory device of FIG. 1A, except for shapes of the lower electrode and the phase change layer pattern. Thus, detailed descriptions of same elements will not be repeated herein.

Referring to FIG. 2, a lower electrode 254a may partially fill a first contact hole 252 formed through a second insulating interlayer 250 to make contact with the second conductive pattern 147b. The lower electrode 254a may not be surrounded by a spacer unlike the lower electrode 156 of FIG. 1A. In example embodiments, a bottom surface of the lower electrode 254a may be smaller than a top surface of the second conductive pattern 147b.

A phase change layer pattern 260 filling a remaining portion of the first contact hole 252 may be disposed on the lower electrode 254a.

An upper electrode 265 may be disposed on the second insulating interlayer 250 to make contact with the phase change layer pattern 260. A third insulating interlayer 270 covering the upper electrode 265 may be disposed on the second insulating interlayer 250. An upper electrode contact 275 may be disposed on the upper electrode 265 through the third insulating interlayer 270. A bit line 280 may be disposed on the third insulating interlayer 270 to be electrically connected to the upper electrode 265 via the upper electrode contact 275.

While two metal silicide patterns 130 at both lateral portions of the impurity region 135 are illustrated in FIG. 2, the metal silicide patterns may be also connected to each other as illustrated in FIG. 1B. As described above, the metal silicide pattern 130 may be at least partially buried or embedded in the impurity region 135 that may serve as a word line of the phase change memory device. Thus, a cell resistance between the P-N diode 149 and the word line may be reduced. As the cell resistance decreases, a current may easily flow from the P-N diode 149 to the lower electrodes 156 and 254a, and from the lower electrodes 156 and 254a to the phase change layer patterns 160 and 260 by a small voltage. Further, the phase change memory device may have small cell current distributions and enhanced operational characteristics.

FIGS. 3 to 22 are cross-sectionals views of stages in a method of manufacturing phase change memory devices in accordance with example embodiments.

Figure 3:
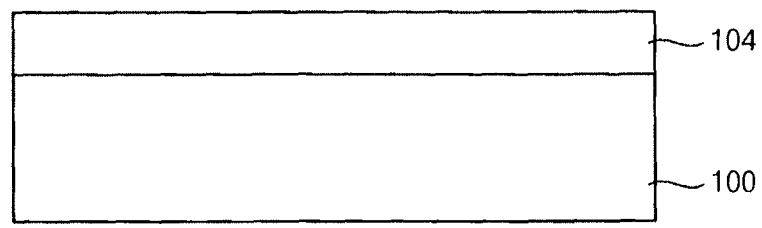
FIGS. 3 to 22 illustrate cross-sectionals views of methods of manufacturing phase change memory devices in accordance with example embodiments.

Referring to FIG. 3, a mask layer 104 may be formed on the substrate 100, e.g., a semiconductor substrate. For example, the substrate 100 may include a silicon substrate, a germanium substrate, a silicon-germanium substrate, a silicon-on-insulator (SOI) substrate, a germanium-on-insulator (GOI) substrate, etc.

The mask layer 104 may be formed using, e.g., silicon nitride. The mask layer 104 may be formed by a chemical vapor deposition (CVD) process, a low pressure vapor deposition process (LPCVD) process, a plasma enhanced chemical vapor deposition (PECVD) process, a high density plasma chemical vapor deposition (HDP-CVD) process, etc.

In one example embodiment, a pad oxide layer (not illustrated) may be further formed between the substrate 100 and the mask layer 104. The pad oxide layer may prevent the mask layer 104 from directly transferring a stress to the substrate 100. The pad oxide layer may be formed by performing a thermal oxidation process on the substrate 100.

Figure 4:
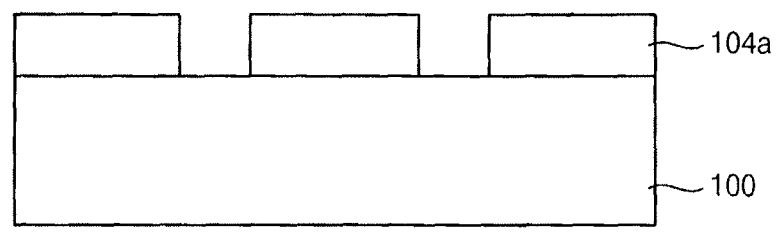

Referring to FIG. 4, the mask layer 104 may be partially etched by, e.g., a photolithography process to form a mask 104a. In example embodiments, a plurality of the masks 104a may be spaced apart from each other along the first direction. Each mask 104a may extend in the second direction.

Figure 5:
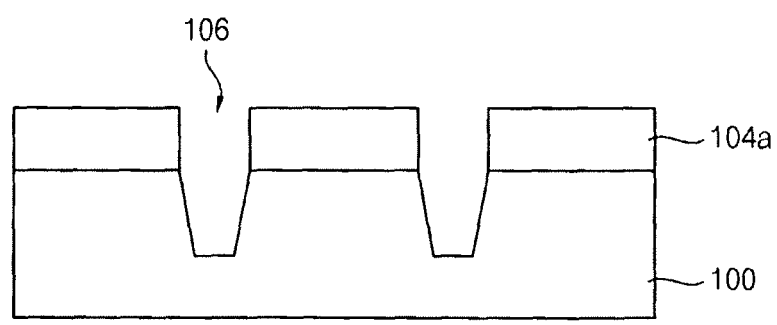
Figure 5:

Referring to FIG. 5, an upper portion of the substrate 100 may be etched using the mask 104a as an etching mask to form a plurality of first trenches 106. The first trench 106 may be defined by sidewalls of the mask 104a and an etched top surface of the substrate 100. The substrate 100 may be divided into the active region I and the isolation region II by forming the first trenches 106. A portion of the substrate 100 including the first trench 106 may be defined as the isolation region II, and a portion of the substrate 100 not including the first trench 106 may be defined as the active region I.

Figure 6:
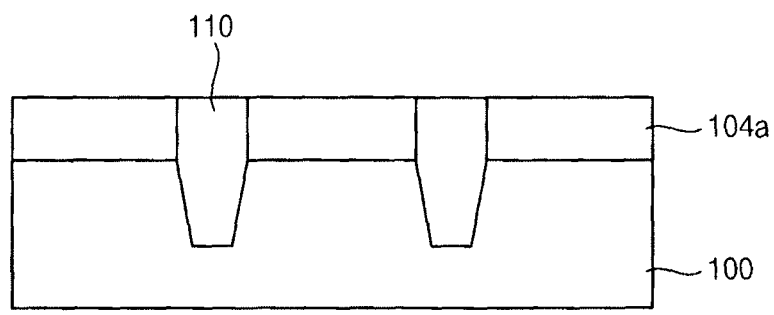

Referring to FIG. 6, an isolation layer 110 filling each first trench 106 may be formed on the substrate 100. In example embodiments, an oxide layer sufficiently filling the first trenches 106 may be formed on the substrate 100 and the mask 104a. The oxide layer may be formed using silicon oxide, e.g., a Middle-Temperature Oxide (MTO), a HDP oxide, a CVD oxide, etc. An upper portion of the oxide layer may be planarized until a top surface of the mask 104a is exposed to form the isolation layer 110. The planarization process may include a chemical mechanical polishing (CMP) process and/or an etch-back process.

Figure 7:
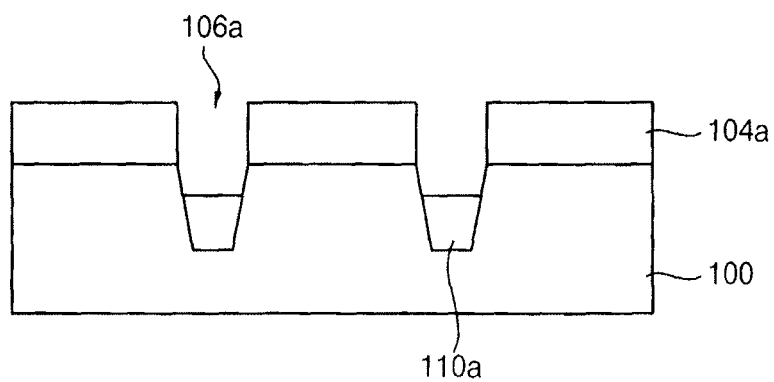

Referring to FIG. 7, an upper portion of the isolation layer 110 may be removed by, e.g., an etch-back process or a wet etching process using a hydrofluoric acid (HF) solution or a buffer oxide etchant (BOE) solution to form a first isolation layer pattern 110a. In example embodiments, a top surface of the first isolation layer pattern 110a may be lower than that of the substrate 100. A remaining portion of the first trench 106, i.e., a portion of the first trench 106 above the first isolation layer pattern 110a and after forming the first isolation layer pattern 110a, may be referred to as a second trench 106a, hereinafter.

Figure 8:
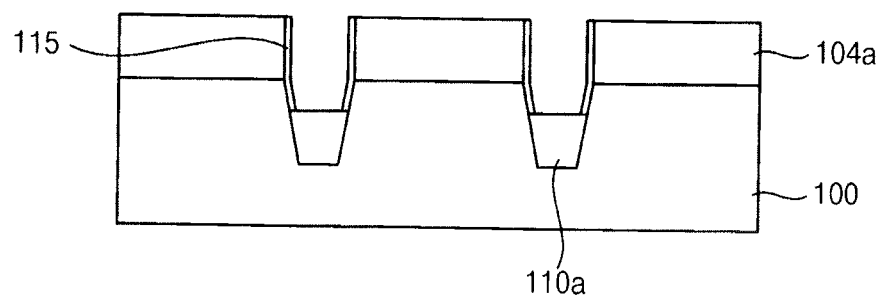

Referring to FIG. 8, a first spacer 115 may be formed on a sidewall of the second trench 106a. In example embodiments, a first spacer layer may be formed along the sidewall of the second trench 106a, the mask 104a, and the first isolation layer pattern 110a. The first spacer layer may be anisotropically etched to form the first spacer 115. The first spacer layer may be formed using silicon nitride by, e.g., a CVD process, a PECVD process, a LPCVD process.

Figure 9:
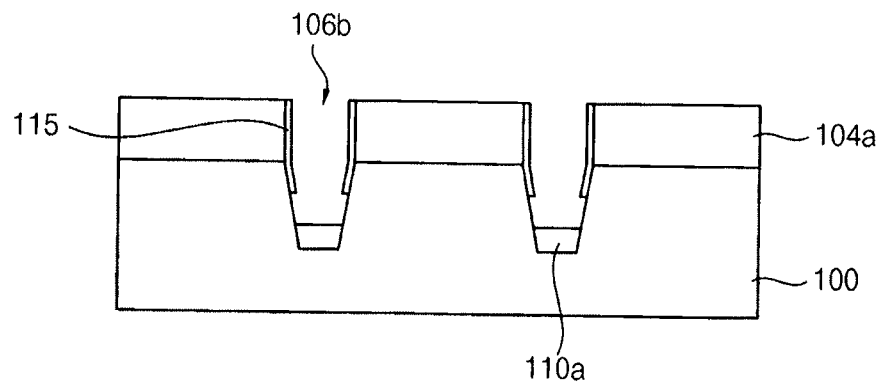

Referring to FIG. 9, an upper portion of the first isolation layer pattern 110a may be removed to form a third trench 106b. Accordingly, a lateral portion of the active region of the substrate 100 may be partially exposed between the first spacer 115 and the first isolation layer pattern 110a. In example embodiments, the upper portion of the first isolation layer pattern 110a may be removed by, e.g., an etch-back process or a wet etching process using a HF solution or a BOE solution.

Figure 10:
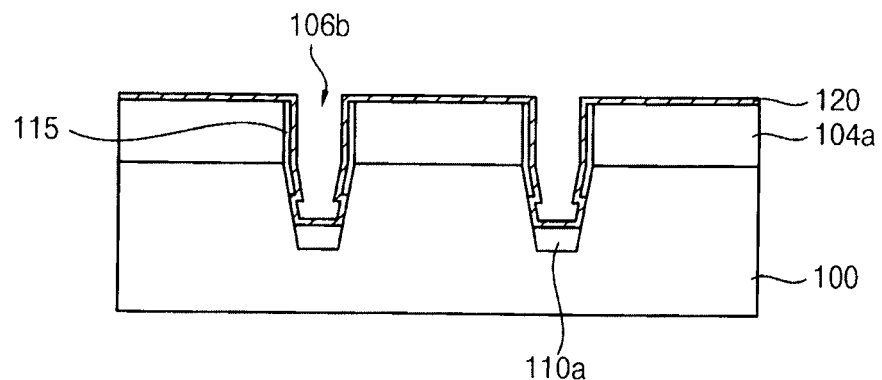

Referring to FIG. 10, a metal layer 120 may be formed conformally on the mask 104a, the first spacer 115, an exposed surface of the substrate 100, and the first isolation layer pattern 110a. In example embodiments, the metal layer 120 may be formed using, e.g., cobalt (Co) or nickel (Ni). The metal layer 120 may be obtained by, e.g., a physical vapor deposition (PVD) process, an atomic layer deposition (ALD) process, a sputtering process, etc.

Figure 11A:
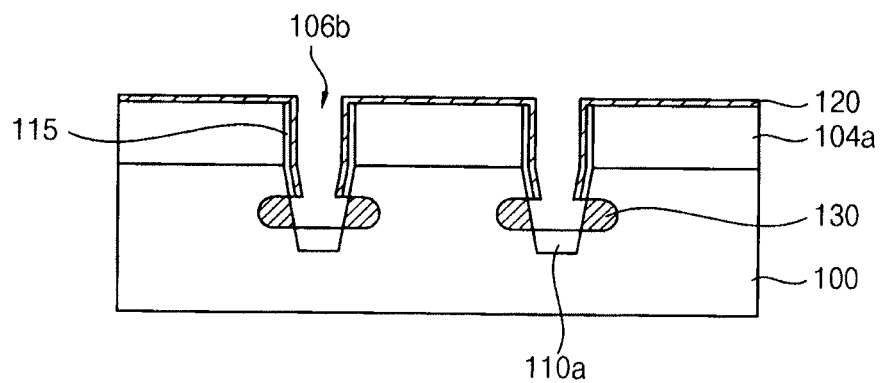

Referring to FIG. 11A, the metal layer 120 may be reacted with the lateral portion of the active region of the substrate 100 to form a metal silicide pattern 130. For example, the metal silicide pattern 130 may be formed by a silicidation process through a thermal treatment, e.g., a rapid thermal annealing (RTA). In the case that the metal layer 120 includes cobalt, the metal silicide pattern 130 may include cobalt silicide. In the case that the metal layer 120 includes nickel, the metal silicide pattern 130 may include nickel silicide.

A portion of the substrate 100 which is covered by the first spacer 115 may not be reacted with the metal layer 120. Thus, the first spacer 115 may function as a reaction prevention layer. A portion of the metal layer 120 which is not reacted with the substrate 100 may remain on the mask 104a and the first spacer 115.

Figure 11B:
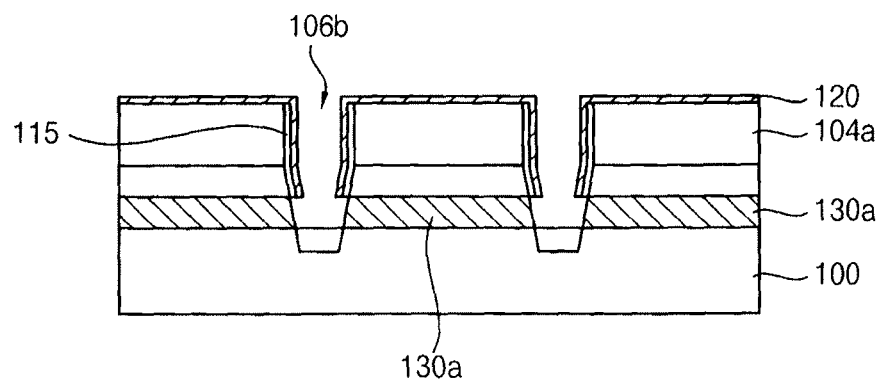

As illustrated in FIG. 11A, the lateral portion of the substrate 100 not covered by the first spacer 115 may be partially transformed into the metal silicide pattern 130. Alternatively, the lateral portion of the substrate 100 not covered by the first spacer 115 may be entirely transformed into a metal silicide pattern 130a, as illustrated in FIG. 11B.

Hereinafter, subsequent processes are described using a construction illustrated in FIG. 11A.

Figure 12:
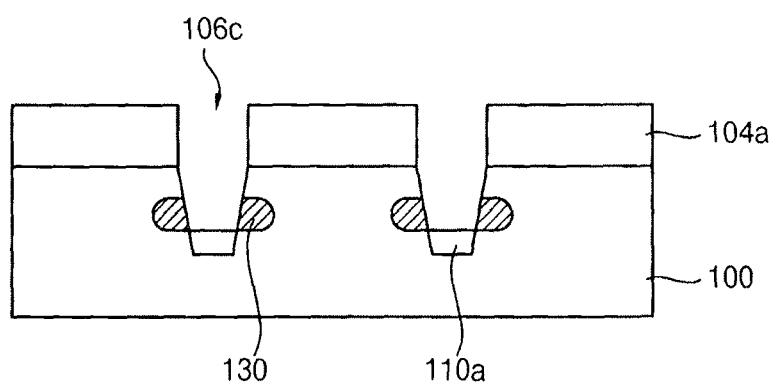

Referring to FIG. 12, the remaining metal layer 120 and the first spacer 115 may be removed to form a fourth trench 106c. The metal layer 120 may be removed by, e.g., a strip process or a wet etching process using an etching solution that may include hydrogen peroxide and an acidic solution. The first spacer 115 may be removed by, e.g., a strip process.

Figure 13:
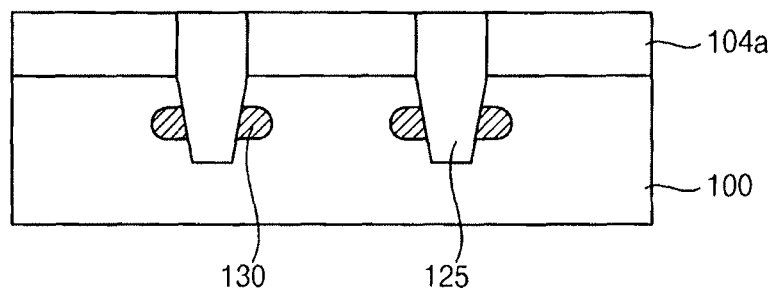

Referring to FIG. 13, a second isolation layer pattern filling the fourth trench 106c may be formed on the first isolation layer pattern 110a. In example embodiments, an oxide layer including an oxide substantially the same as that of the first isolation layer pattern 110a may be formed on the mask 104a and the first isolation layer pattern 110a to sufficiently fill the fourth trench 106c. An upper portion of the oxide layer may be planarized by, e.g., a CMP process and/or an etch-back process, until the top surface of the mask 104a is exposed to form the second isolation layer pattern. The second isolation layer pattern may be merged with the first isolation layer pattern 110a to form an isolation layer pattern 125. In the case that the second isolation layer pattern includes a different material from that of the first isolation layer pattern 110a, the first and second isolation layer patterns may exist as individual or independent structures.

Figure 14:
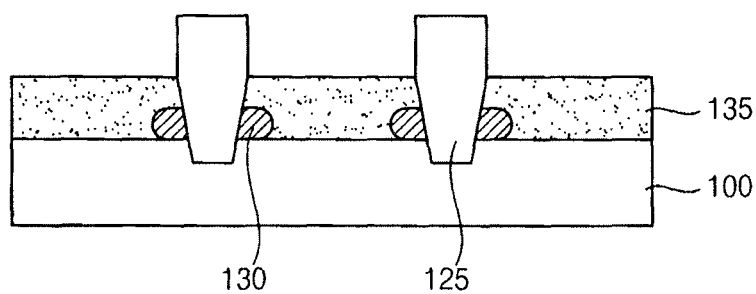

Referring to FIG. 14, the mask 104a may be removed by, e.g., an etch-back process, such that an upper portion of the isolation layer pattern 125 may be exposed. An ion implantation process may be performed to form an impurity region 135 at an upper portion of the substrate 100. In example embodiments, a plurality of the impurity regions 135 may be formed to be spaced apart from each other in the first direction and each impurity region 135 may extend in the second direction. The impurity region 135 may serve as a word line of the phase change memory device.

In example embodiments, 136b,131b surfaces of the impurity region 135 and the metal silicide pattern 130 may be coplanar with each other, e.g., a bottom surface of each of the impurity region 135 and the metal silicide pattern 130 may be directly on an upper surface of the substrate 100. Alternatively, the impurity region 135 may have a bottom surface 136b substantially lower than that of the metal silicide pattern 130, e.g., so the bottom surfaces 136b of the impurity region 135 may be directly on the substrate and the bottom surface 131b of the metal silicide pattern 130 may be between the bottom and upper surfaces 136b,136a of the impurity region 135.

Figure 15:
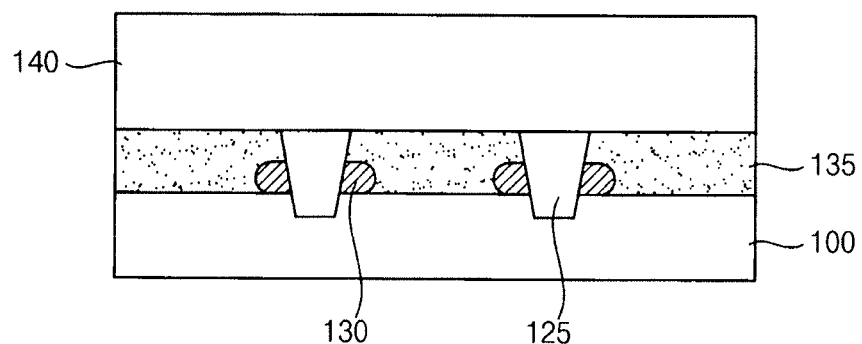

Referring to FIG. 15, an upper portion of the isolation layer pattern 125 may be planarized, such that top surfaces of the isolation layer pattern 125 and the impurity region 135 may be coplanar, e.g., substantially level, with each other. The first insulating interlayer 140 may be formed on the impurity region 135 and the isolation layer pattern 125. The first insulating interlayer 140 may be formed using, e.g., at least one of silicon oxide, silicon nitride, silicon oxynitride, etc. The first insulating interlayer 140 may be obtained by, a CVD process, a PECVD process, a spin coating process, a HDP-CVD process, etc.

Alternatively, the planarization process for the isolation layer pattern 125 may be omitted. For example, the first insulating interlayer 140 may be formed using silicon oxide on the impurity region 135 and the isolation layer pattern 125. In this case, the first insulating interlayer 140 and the isolation layer pattern 125 may be merged with each other.

Figure 16:
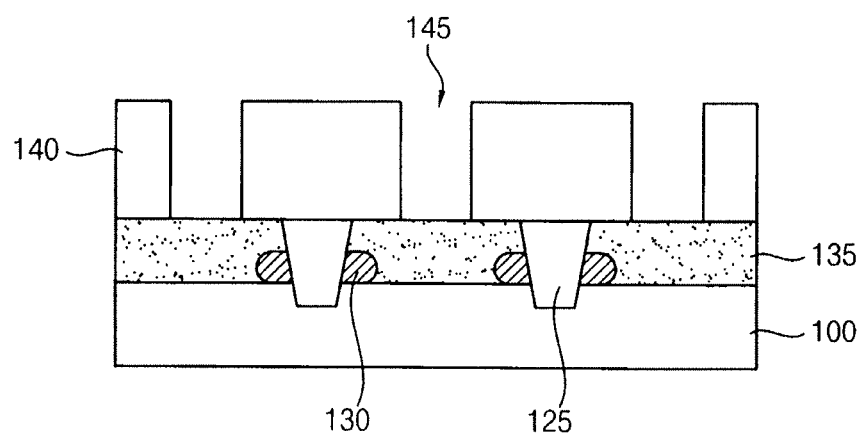

Referring to FIG. 16, the first insulating interlayer 140 may be partially removed by, e.g., a photolithography process, to form an opening 145 at least partially exposing the impurity region 135.

Figure 17:
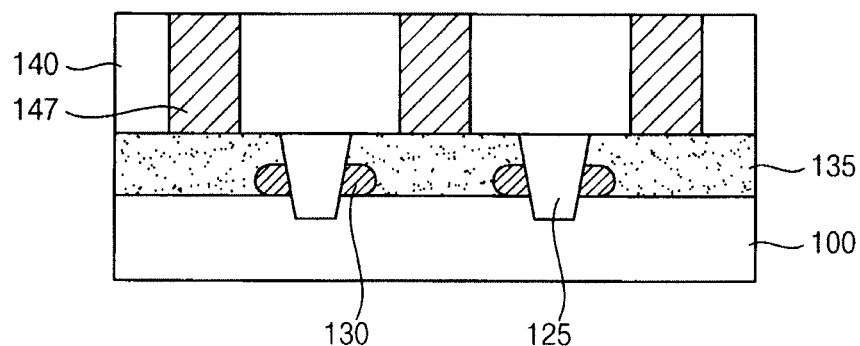

Referring to FIG. 17, a conductive layer 147 filling the opening 145 may be formed on the impurity region 135. In example embodiments, a selective epitaxial growth (SEG) process may be performed using the impurity region 135 as a seed to form the conductive layer 147 filling the opening 145. A planarization process may be further performed on the conductive layer 147, such that top surfaces of the conductive layer 147 and the first insulating interlayer 140 may be coplanar with each other.

If the metal silicide pattern 130 is exposed at the top surface of the impurity region 135, the number of the seed sites may be decreased during the SEG process. Accordingly, an irregular growth of the conductive layer 147 may be caused, and thus the conductive layer 147 may include defects therein. Therefore, according to example embodiments, the metal silicide pattern 130 may be buried within the impurity region 135, e.g., at a predetermined distance under the upper surface of the impurity region 135, so that the metal silicide pattern 130 may not be exposed during the SEG process. That is, as illustrated in FIG. 1A, the upper surface 131a of the metal silicide pattern 130 may be formed between the upper and lower surfaces 136a and 136b of the impurity region 135 to ensure that the upper surface 131a of the metal silicide layer 130 is spaced apart a predetermined distance from the upper surface 136a of the impurity region 135. Therefore, a generation of the defects or the irregular growth of the conductive layer 147 may be prevented or substantially minimized.

Figure 18:
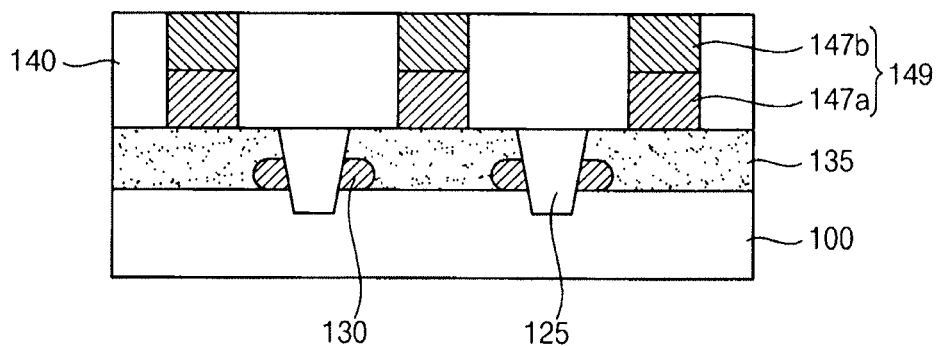

Referring to FIG. 18, impurities may be implanted into the conductive layer 147 to form the first conductive pattern 147a and the second conductive pattern 147b sequentially stacked on the impurity region 135. The first and second conductive patterns 147a and 147b may include different types of the impurities from each other. For example, N-type impurities may be implanted into the conductive layer 147 to form the first conductive pattern 147a doped with the N-type impurities, and P-type impurities may be implanted into an upper portion of the conductive layer 147 to form the second conductive pattern 147b doped with the P-type impurities. Accordingly, a P-N diode 149 may be formed in the opening 145.

In one example embodiment, a silicidation process may be further performed on the P-N diode 149 to form an ohmic pattern (not illustrated) thereon. The ohmic pattern may include a metal silicide.

Figure 19:
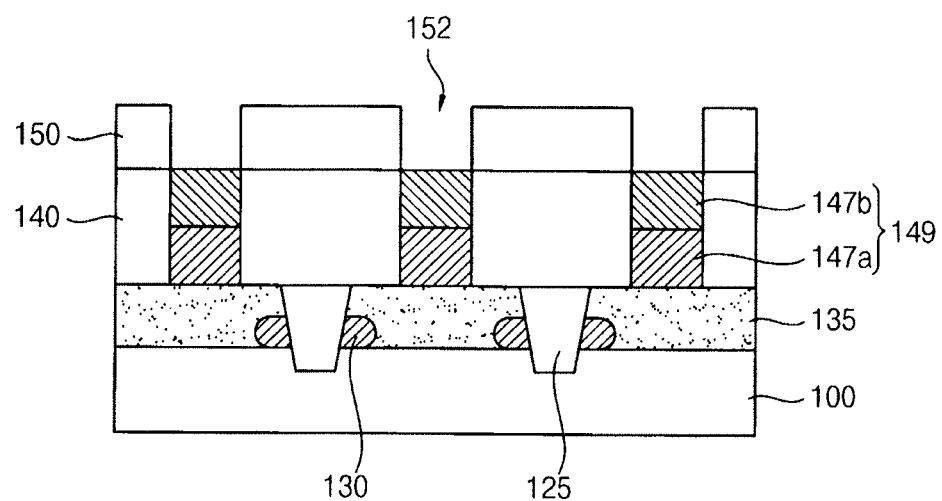

Referring to FIG. 19, the second insulating interlayer 150 may be formed on the first insulating interlayer 140 and the P-N diode 149. The second insulating interlayer 150 may be formed using, e.g., silicon oxide, silicon nitride, silicon oxynitride, etc., by, e.g., a CVD process, a PECVD process, a spin coating process, a HDP-CVD process. The second insulating interlayer 150 may be partially etched to form a first contact hole 152 exposing the second conductive layer pattern 147b.

Figure 20:
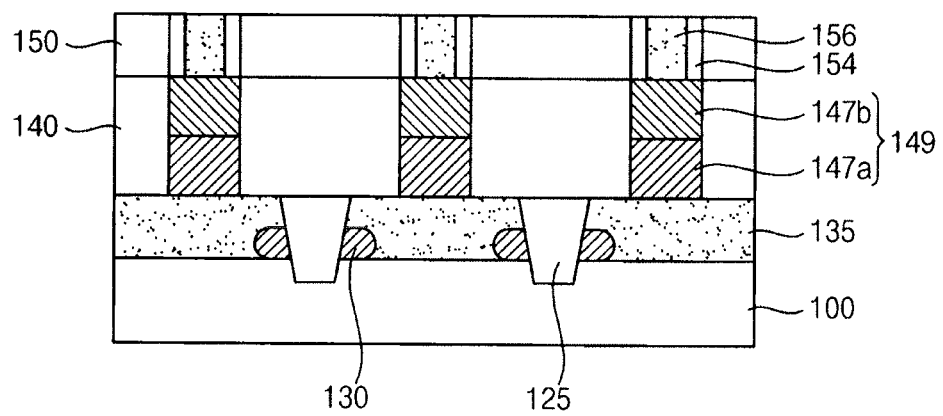

Referring to FIG. 20, the second spacer 154 may be formed on a sidewall of the first contact hole 152, and the lower electrode 156 filling a remaining portion of the first contact hole 152 may be formed on the second conductive pattern 147b.

In example embodiments, a second spacer layer may be formed along the second insulating interlayer 150, an inner wall of the first contact hole 152, and the second conductive pattern 147b using, e.g., silicon nitride. The second spacer layer may be partially removed by an etch-back process or an anisotropic etching process to form the second spacer 154. A lower electrode layer sufficiently filling the first contact hole 152 may be formed on the second conductive pattern 147b. An upper portion of the lower electrode layer 150 may be planarized by a CMP process and/or an etch-back process until a top surface of the second insulating interlayer 150 is exposed to form the lower electrode 156.

As described above, the second spacer 154 may be formed before forming the lower electrode 156. Thus, contact areas between the lower electrode 156 and the second conductive pattern 147b, and between the lower electrode 156 and a phase change layer pattern 160 (see FIG. 21) may be reduced to improve a heating efficiency of the phase change layer pattern 160.

The lower electrode layer may be formed using a metal nitride or a metal silicon nitride, e.g., at least one of titanium nitride, titanium silicon nitride, tungsten nitride, tungsten silicon nitride, tantalum nitride, tantalum silicon nitride, zirconium nitride, zirconium silicon nitride, etc. The lower electrode layer may be obtained by, e.g., an ALD process, a PVD process, a sputtering process.

Figure 21:
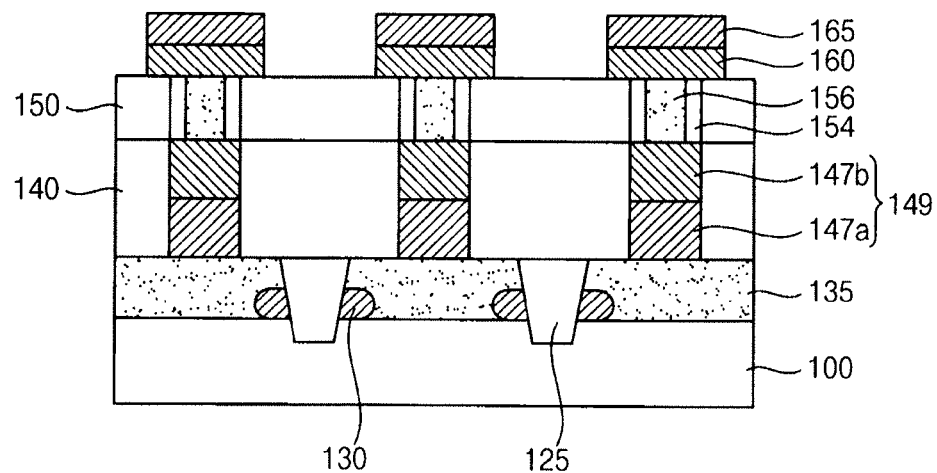

Referring to FIG. 21, a phase change layer and an upper electrode layer may be sequentially formed on the lower electrode 156, the second spacer 154, and the second insulating interlayer 150. The upper electrode layer and the phase change layer may be patterned to form the upper electrode 165 and the phase change layer pattern 160 connected to the lower electrode 156.

In example embodiments, the phase change layer may be formed using a chalcogen compound or a chalcogen compound doped with carbon, nitrogen and/or a metal. The chalcogen compound may include, e.g., at least one of GeSbSe, SbSe, GeSbTe, SbTe, GeSb, AsSbTe, SnSbTe, SnInSbTe, etc. These may be used alone or in a mixture thereof. The phase change layer may be obtained by a PVD process, a sputtering process, etc. The upper electrode layer may be formed using, e.g., doped polysilicon, a metal, a metal nitride or a metal silicide by a CVD process, an ALD process, a sputtering process, etc.

Figure 22:
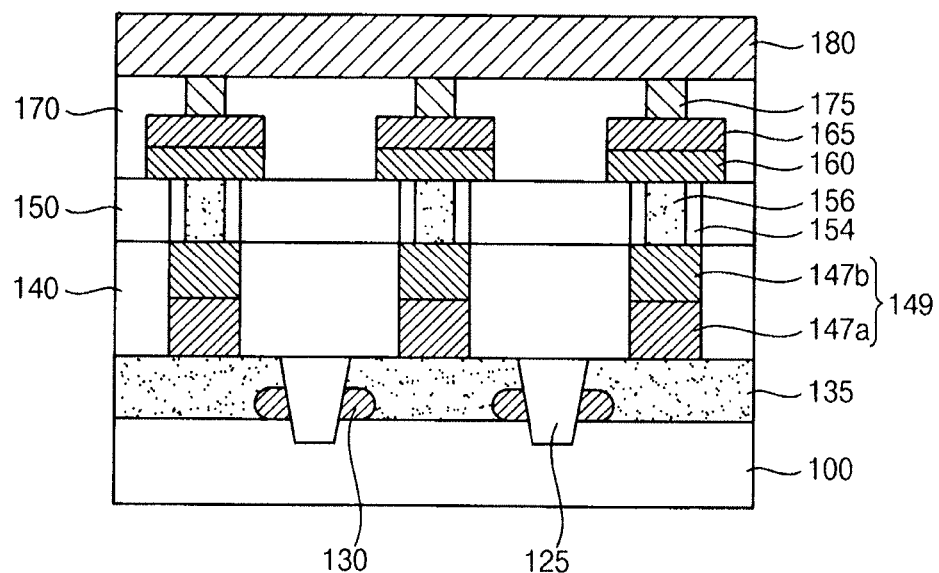
Figure 22:

Referring to FIG. 22, the upper electrode contact 175 and the bit line 180 electrically connected to the upper electrode 165 via the upper electrode contact 175 may be formed. In example embodiments, the third insulating interlayer 170 covering the phase change layer pattern 160 and the upper electrode 165 may be formed on the second insulating interlayer 150. The third insulating interlayer 170 may be partially removed to form a second contact hole (not illustrated) partially exposing the upper electrode 165. A conductive layer sufficiently filling the second contact hole may be formed on the third insulating interlayer 170 and the upper electrode 165. An upper portion of the conductive layer may be planarized to form the upper electrode contact 165.

The bit line 180 may be formed on the third insulating interlayer 170 and the upper electrode contact 175 using, e.g., a metal, a metal nitride or doped polysilicon. In example embodiments, the bit line 180 may extend in the first direction.

FIGS. 23 to 27 are cross-sectional views of stages in a method of manufacturing a phase change memory device in accordance with other example embodiments.

Figure 23:
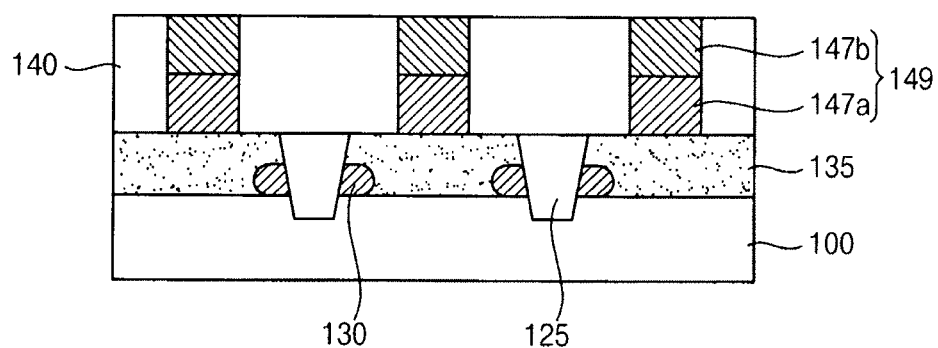
FIGS. 23 to 27 illustrate cross-sectional views of a method of manufacturing a phase change memory device in accordance with some example embodiments.

Referring to FIG. 23, processes substantially the same as or similar to those illustrated with reference to FIGS. 3 to 18 may be performed. Accordingly, the impurity region 135 in which the metal silicide pattern 130 may be at least partially buried or embedded may be formed at the upper portion of the substrate 100. The P-N diode 149 may be formed on the impurity region 135 through the first insulating interlayer 140.

Figure 24:
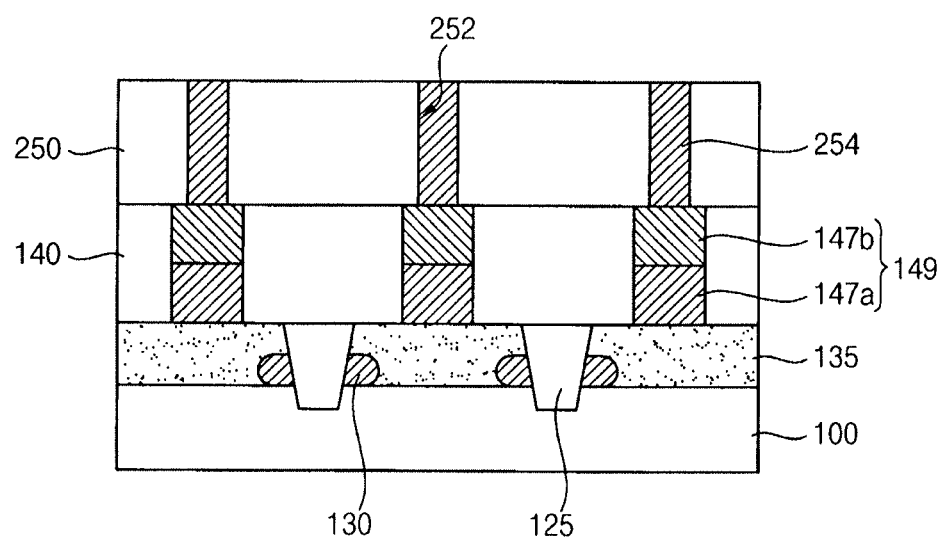

Referring to FIG. 24, a second insulating interlayer 250 may be formed on the first insulating interlayer 140 and the second conductive pattern 147b of the P-N diode 149. The second insulating interlayer 250 may be partially removed to form a first contact hole 252 partially exposing the second conductive pattern 147b. A lower electrode layer sufficiently filling the fist contact hole 252 may be formed on the second conductive pattern 147b and the second insulating interlayer 250. An upper portion of the lower electrode layer may be planarized to form the lower electrode 254. In example embodiments, the lower electrode 254 may have a cross-section smaller than a top surface of the second conductive pattern 147b.

Figure 25:
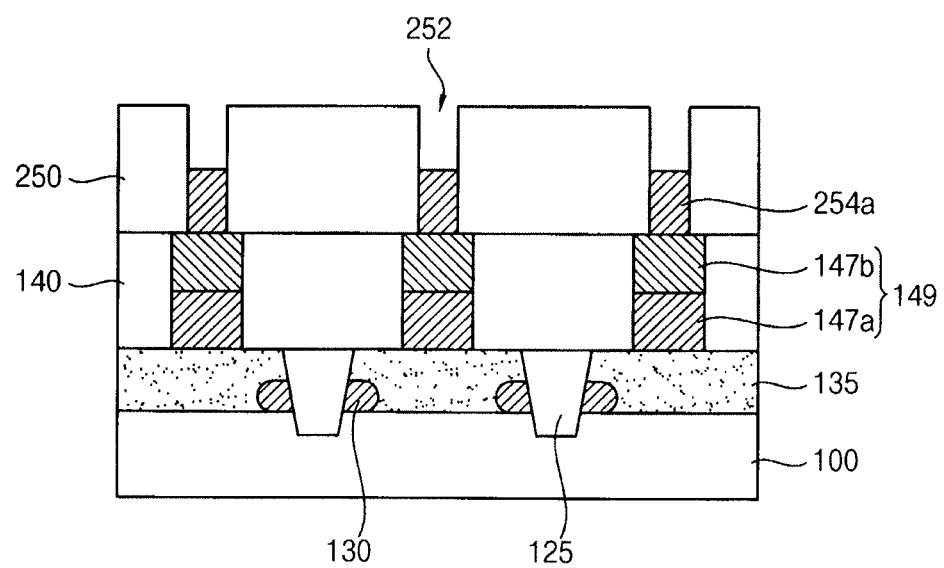

Referring to FIG. 25, the upper portion of the lower electrode 254 may be removed by a dry etching process or a wet etching process to form the lower electrode pattern 254a partially filling the first contact hole 252.

Figure 26:
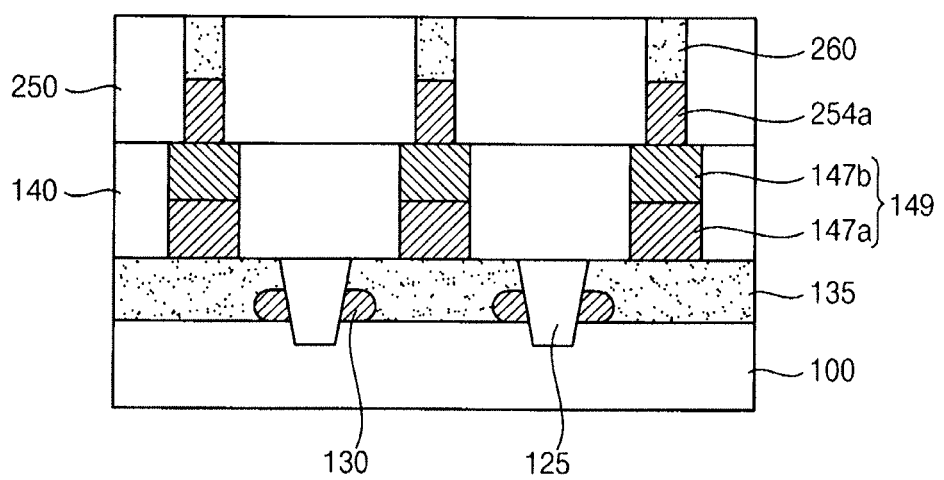

Referring to FIG. 26, the phase change layer pattern 260 filling a remaining portion of the first contact hole 252 may be formed on the lower electrode pattern 254a. In example embodiments, a phase change layer sufficiently filling the first contact hole may be formed on the second insulating interlayer 250 and the lower electrode pattern 254a using a chalcogen compound, e.g., at least one of GeSbSe, SbSe, GeSbTe, SbTe, GeSb, etc. The phase change layer may be partially planarized until a top surface of the second insulating interlayer 150 is exposed to form the phase change layer pattern 260.

In example embodiments, the phase change layer pattern 260 and the lower electrode layer pattern 254a may have a common cross-section and may be buried in the second insulating interlayer 250. Thus, an efficiency of transferring heat and/or current to the phase change layer pattern 260 may be improved.

Figure 27:
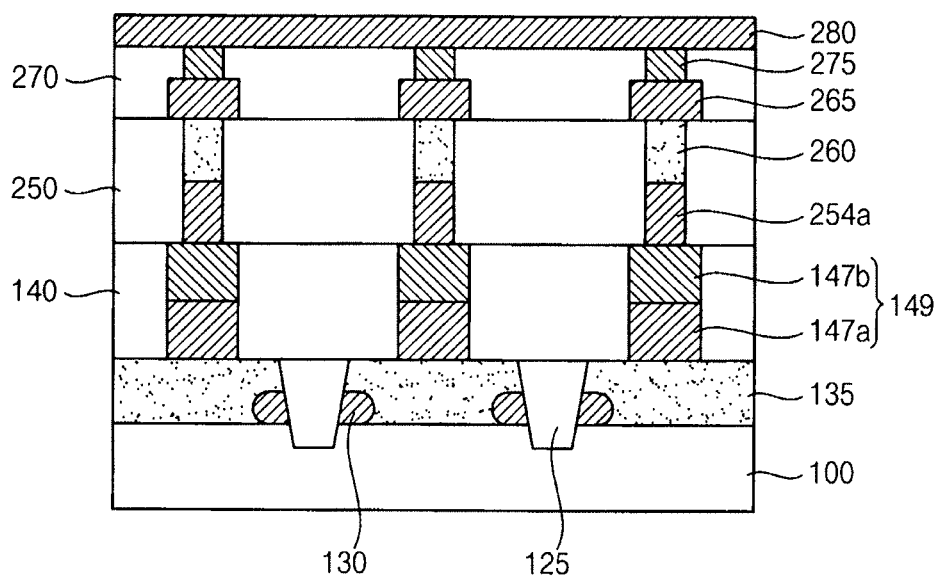

Referring to FIG. 27, an upper electrode layer may be formed on the second insulating interlayer 150 and the phase change layer pattern 260. The upper electrode layer may be patterned to form an upper electrode 265 contacting the phase change layer pattern 260.

The third insulating interlayer 270 covering the upper electrode 265 may be formed on the second insulating interlayer 250. The upper electrode contact 275 may be formed on the upper electrode 265 through the third insulating interlayer 270. The bit line 280 electrically connected to the upper electrode 265 via the upper electrode contact 275 may be formed on the third insulating interlayer 270.

As described above, according to example embodiments, a phase change memory device may include a metal silicide pattern embedded or buried in an active region functioning as a word line of the phase change memory device, thereby reducing resistance of the words line. Thus, a cell resistance generated between the word line and a P-N diode may be reduced, so that a current may easily flow from the P-N diode to a lower electrode and from the lower electrode to a phase change material pattern by relatively small power or voltage. Therefore, the phase change memory device may have small cell current distributions and enhanced operational characteristics.

In contrast, in a conventional phase change memory device with a P-N diode, e.g., a phase change memory device without metal silicides in an impurity region functioning as a word line, as a critical dimension of each cell decreases for achieving a high degree of integration, an electrical resistance between the P-N diode and an active region of the phase change memory device may be increased. Thus, a current may not be easily transferred from a contact or a metal wiring to the cell of the phase change memory device. Further, current distributions of the cells may become larger.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A phase change memory device, comprising:
   an impurity region on a substrate, the impurity region being in an active region;
   a metal silicide pattern at least partially buried in the impurity region, an upper surface of the metal silicide pattern is spaced a predetermined distance from an upper surface of the impurity region;
   a diode on the impurity region;
   a lower electrode on the diode;
   a phase change layer pattern on the lower electrode; and
   an upper electrode on the phase change layer pattern.

2. The device as claimed in claim 1, wherein the substrate is divided into the active region and an isolation region by an isolation layer pattern, the metal silicide pattern contacting a sidewall of the isolation layer pattern.

3. The device as claimed in claim 1, wherein bottom surfaces of the metal silicide pattern and the impurity region are coplanar with each other.

4. The device as claimed in claim 1, wherein a bottom surface of the impurity region is lower than that of the metal silicide pattern.

5. The device as claimed in claim 1, wherein the metal silicide pattern includes two metal silicide patterns at opposite lateral portions of the impurity region, the two metal silicide patterns being spaced apart from each other.

6. The device as claimed in claim 1, wherein the metal silicide pattern includes cobalt silicide or nickel silicide.

7. The device as claimed in claim 1, wherein the impurity region is a word line extending in a second direction.

8. The device as claimed in claim 7, wherein the metal silicide pattern extends in the second direction.

9. The device as claimed in claim 7, further comprising a bit line electrically connected to the upper electrode, the bit line extending in a first direction perpendicular to the second direction.

10. The device as claimed in claim 1, wherein a distance between an upper surface of the metal silicide pattern and the substrate is smaller than a distance between an upper surface of the impurity region and the substrate, both upper surfaces of the metal silicide pattern and the impurity region facing away from the substrate.

11. A phase change memory device, comprising:
    an impurity region in an upper portion of a substrate, the impurity region being a word line;
    a metal silicide pattern inside the impurity region, an upper surface of the metal silicide pattern being spaced a predetermined distance from an upper surface of the impurity region;
    a diode on the upper surface of the impurity region, the upper surfaces of the metal silicide pattern and the impurity region facing the diode;
    a lower electrode on the diode;
    a phase change layer pattern on the lower electrode; and
    an upper electrode on the phase change layer pattern.

12. The device as claimed in claim 11, further comprising an isolation layer pattern through the impurity region, the metal silicide pattern contacting the isolation layer pattern.

13. The device as claimed in claim 11, further comprising an isolation layer pattern defining the active region, the impurity region extending in the entire active region, and the metal silicide pattern contacting the isolation layer pattern.

* * * * *